(12) United States Patent
Suzuki et al.

(10) Patent No.: US 10,629,445 B2
(45) Date of Patent: Apr. 21, 2020

(54) WAFER PROCESSING METHOD

(71) Applicant: DISCO CORPORATION, Tokyo (JP)

(72) Inventors: Katsuhiko Suzuki, Tokyo (JP); Hisashi Arakida, Tokyo (JP); Tomoaki Sugiyama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/020,577

(22) Filed: Jun. 27, 2018

(65) Prior Publication Data

US 2019/0006185 A1 Jan. 3, 2019

(30) Foreign Application Priority Data

Jun. 30, 2017 (JP) .................. 2017-128922

(51) Int. Cl.
| | |
|---|---|
| *H01L 21/00* | (2006.01) |
| *H01L 21/304* | (2006.01) |
| *H01L 21/77* | (2017.01) |
| *H01L 21/683* | (2006.01) |
| *H01L 21/78* | (2006.01) |
| *B28D 5/02* | (2006.01) |

(52) U.S. Cl.
CPC ........ *H01L 21/304* (2013.01); *H01L 21/6836* (2013.01); *H01L 21/77* (2013.01); *H01L 21/78* (2013.01); *B28D 5/022* (2013.01); *H01L 2221/6834* (2013.01); *H01L 2221/68327* (2013.01)

(58) Field of Classification Search
CPC ... H01L 21/78; H01L 21/304; H01L 21/6836; B28D 5/022
See application file for complete search history.

(56) References Cited

U.S. PATENT DOCUMENTS

| | | | | |
|---|---|---|---|---|
| 3,811,182 A | * | 5/1974 | Ryan, Sr. .......... | H01L 21/67144 29/25.01 |
| 6,157,213 A | * | 12/2000 | Voogel ................ | H01L 27/0207 257/670 |
| 6,362,651 B1 | * | 3/2002 | Voogel ................ | H01L 27/0207 257/620 |

(Continued)

FOREIGN PATENT DOCUMENTS

| | | |
|---|---|---|
| JP | 2000288881 A | 10/2000 |
| JP | 2007019379 A | 1/2007 |
| JP | 2007059829 A | 3/2007 |

*Primary Examiner* — Nicholas J Tobergte
(74) *Attorney, Agent, or Firm* — Greer Burns & Crain Ltd.

(57) ABSTRACT

A wafer processing method for processing a wafer having devices on the front side is provided. The wafer processing method includes a back grinding step of grinding the wafer to form a recess and an annular reinforcing portion surrounding the recess on the back side of the wafer, and a dividing step of cutting the wafer along division lines formed on the front side of the wafer. In the back grinding step, a taper surface is formed between the bottom surface of the recess and the annular reinforcing portion. The taper surface is inclined with respect to a direction perpendicular to the bottom surface of the recess. In the dividing step, a cutting blade is lowered to start cutting at a position radially inside the outer circumference of the wafer and is subsequently raised to stop cutting at another position radially inside the outer circumference of the wafer.

9 Claims, 7 Drawing Sheets

(56) References Cited

U.S. PATENT DOCUMENTS

| | | | |
|---|---|---|---|
| 7,629,230 B2* | 12/2009 | Sekiya | H01L 21/78 |
| | | | 257/E21.599 |
| 7,858,496 B2* | 12/2010 | Kajiyama | H01L 21/6835 |
| | | | 438/460 |
| 8,541,287 B2* | 9/2013 | Sekiya | H01L 33/0095 |
| | | | 438/462 |
| 9,887,091 B2* | 2/2018 | Suzuki | B24B 1/00 |
| 2015/0235900 A1* | 8/2015 | Bieck | H01L 21/3043 |
| | | | 438/669 |

* cited by examiner

WAFER PROCESSING METHOD

BACKGROUND OF THE INVENTION

Field of the Invention

The present invention relates to a wafer processing method for forming an annular reinforcing portion on the back side of a wafer.

Description of the Related Art

A plurality of crossing division lines are set on the front side of a wafer to thereby define a plurality of separate regions, in which a plurality of devices such as integrated circuits (ICs) and large scale integrated circuits (LSIs) are formed. In such a wafer having the devices on the front side, the back side of the wafer is ground to reduce the thickness of the wafer to a predetermined thickness. Thereafter, the wafer is divided along the division lines to obtain individual device chips each corresponding to the devices. The device chips are widely used in various electronic equipment such as mobile phones and personal computers.

For example, the back side of the wafer is ground by using a grinding apparatus including a plurality of grinding wheels (see Japanese Patent Laid-open No. 2000-288881). In this grinding apparatus, the back side of the wafer is first coarsely ground at a high grinding speed by using a first grinding wheel, and the back side of the wafer is next finely ground at a low grinding speed until the thickness of the wafer is reduced to a predetermined thickness by using a second grinding wheel. However, when the wafer is thinned by grinding, the rigidity of the wafer is reduced, so that handling of the wafer in subsequent steps becomes difficult. To cope with this problem, there has been developed a grinding method of grinding the back side of the wafer in only a central area corresponding to a device area formed on the front side of the wafer where the devices are formed, thereby forming a recess on the back side of the wafer in this central area, so that the outside area around this recess is left as an annular reinforcing portion having a necessary strength (see Japanese Patent Laid-open No. 2007-19379).

After grinding the back side of the wafer to form the recess, a dicing tape is attached to the back side of the wafer. The dicing tape has a diameter larger than the diameter of the wafer. That is, a central portion of the dicing tape is attached to the back side of the wafer. A peripheral portion of the dicing tape is mounted (attached) on an annular frame having an inside opening larger in diameter than the wafer. That is, the annular frame has an inner diameter larger than the diameter of the wafer and has an outer diameter larger than the diameter of the dicing tape. Thus, the wafer is supported through the dicing tape to the annular frame, thereby forming a frame unit. Thereafter, the frame unit is transferred to a cutting apparatus including a cutting blade to cut the wafer along the division lines. The cutting apparatus includes a chuck table having an outer diameter smaller than the diameter of the bottom surface of the recess formed on the back side of the wafer. In dividing the wafer, the wafer is held on the chuck table under suction in the condition where the front side of the wafer is exposed upward. The chuck table has an upper surface as a holding surface for holding the wafer. Accordingly, the bottom surface of the recess formed on the back side of the wafer is in contact with the holding surface of the chuck table through the dicing tape. In this condition, the cutting blade is rotated and lowered to cut the wafer along the division lines from the front side, thereby dividing the wafer into the device chips (see Japanese Patent Laid-open No. 2007-59829).

SUMMARY OF THE INVENTION

In attaching the dicing tape to the back side of the wafer on which the recess is formed, it is not easy to bring the dicing tape into close contact with the boundary between the recess and the annular reinforcing portion surrounding the recess. The recess has such a shape that the angle formed between the bottom surface of the recess and the side surface (inner circumferential surface) of the recess is approximately 90 degrees, so that the angle formed between the side surface of the recess and the annular reinforcing portion is also approximately 90 degrees. Accordingly, the dicing tape is bent at approximately 90 degrees along the inner circumferential edge of the annular reinforcing portion, so that it is difficult to bring the dicing tape into close contact with the back side of the wafer having the recess. In the case that the dicing tape is not brought into close contact with the boundary between the recess and the annular reinforcing portion on the back side of the wafer, there is a possibility that a crack may be generated near the above boundary of the wafer by a force applied from the cutting blade in cutting the wafer. Further, there is also a possibility that cutting dust may enter a space formed between the wafer and the dicing tape and that this cutting dust may stick to the back side of the wafer. As a result, there arises a problem such that the quality of each device chip present near the outer circumference of the device area of the wafer may be reduced.

Further, in the dividing step, the wafer in the condition of the frame unit is held on the holding surface of the chuck table. Since the diameter of the holding surface of the chuck table is smaller than the diameter of the bottom surface of the recess formed on the back side of the wafer, the dicing tape is pulled radially outward by the weight of the annular frame present outside the holding surface of the chuck table. As a result, the wafer receives a radially outward force. During cutting of the wafer by the cutting blade, the device chips divided from the wafer receive forces having different directions, so that there is a possibility that the wafer may be moved in a plane parallel to the holding surface of the chuck table during cutting, causing a problem such that the wafer cannot be properly cut along each division line.

It is therefore an object of the present invention to provide a wafer processing method which can bring a dicing tape into close contact with the back side of a wafer on which a recess and an annular reinforcing portion surrounding the recess are formed, and the dicing tape can be kept in close contact with the boundary between the recess and the annular reinforcing portion, thereby properly cutting the wafer.

In accordance with an aspect of the present invention, there is provided a wafer processing method for processing a wafer having a front side and a back side opposite to the front side, the front side of the wafer having a device area and a peripheral marginal area surrounding the device area, a plurality of crossing division lines being formed on the front side of the wafer to thereby define a plurality of separate regions in each of which a plurality of devices are formed, the wafer processing method including a back grinding step of grinding the back side of the wafer in a central area corresponding to the device area of the front side to thereby form a recess having a bottom surface in the central area of the back side and also form an annular reinforcing portion surrounding the recess; a dicing tape attaching step of attaching a dicing tape to the back side of the wafer; and a dividing step of cutting the wafer along the division lines from the front side of the wafer by using a cutting blade to thereby divide the wafer into a plurality of individual device chips each corresponding to the devices; the back grinding step including the step of forming a taper surface between the bottom surface of the recess and the annular reinforcing portion so that the taper surface connects the bottom surface of the recess and the annular reinforcing portion and the taper surface is inclined with respect to a direction perpendicular to the bottom surface of the recess; the dividing step including the steps of relatively moving the cutting blade and the wafer along a predetermined one of the division lines and lowering the cutting blade toward the wafer to start cutting of the wafer at one end of the predetermined division line radially inside the outer circumference of the wafer, whereas raising the cutting blade from the wafer to stop cutting of the wafer at the other end of the predetermined division line radially inside the outer circumference of the wafer.

Preferably, the taper surface to be formed in the back grinding step has a taper angle defined as a supplementary angle of the angle formed between the taper surface and the bottom surface of the recess, the taper angle being set in the range of 30 to 75 degrees.

In the wafer processing method according to the aspect of the present invention, the back side of the wafer is ground in a central area corresponding to the device area of the front side in the back grinding step. The outside area around the central area of the back side to be ground is not ground to be left as an annular reinforcing portion. Accordingly, the inside area surrounded by the annular reinforcing portion of the back side is formed as a recess having a bottom surface formed by grinding the back side. The side surface of the recess formed on the back side of the wafer so as to connect the bottom surface and the annular reinforcing portion is formed as the taper surface. That is, the angle formed between the taper surface and the annular reinforcing portion is not 90 degrees. In other words, the angle formed between the taper surface and the bottom surface of the recess is not 90 degrees. Accordingly, in attaching the dicing tape to the back side of the wafer, the dicing tape can be easily brought into close contact with the back side of the wafer.

In the wafer processing method according to the aspect of the present invention, the annular area along the outer circumference of the wafer is not cut by the cutting blade in the dividing step. Accordingly, even when the dicing tape is pulled radially outward by the weight of the annular frame in the dividing step, the annular uncut area of the wafer functions to support the dicing tape present radially outside the annular uncut area, so that the force pulling the dicing tape is not transmitted to the central area of the wafer radially inside the annular uncut area. As a result, the movement of the wafer in a plane parallel to the holding surface of the chuck table during cutting of the wafer can be suppressed to thereby allow proper cutting of the wafer along each division line. As described above, in the wafer processing method according to the aspect of the present invention, the dicing tape can be brought into close contact with the back side of the wafer on which the recess and the annular reinforcing portion surrounding the recess are formed. The dicing tape can be kept in close contact with the boundary between the recess and the annular reinforcing portion, thereby properly cutting the wafer.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
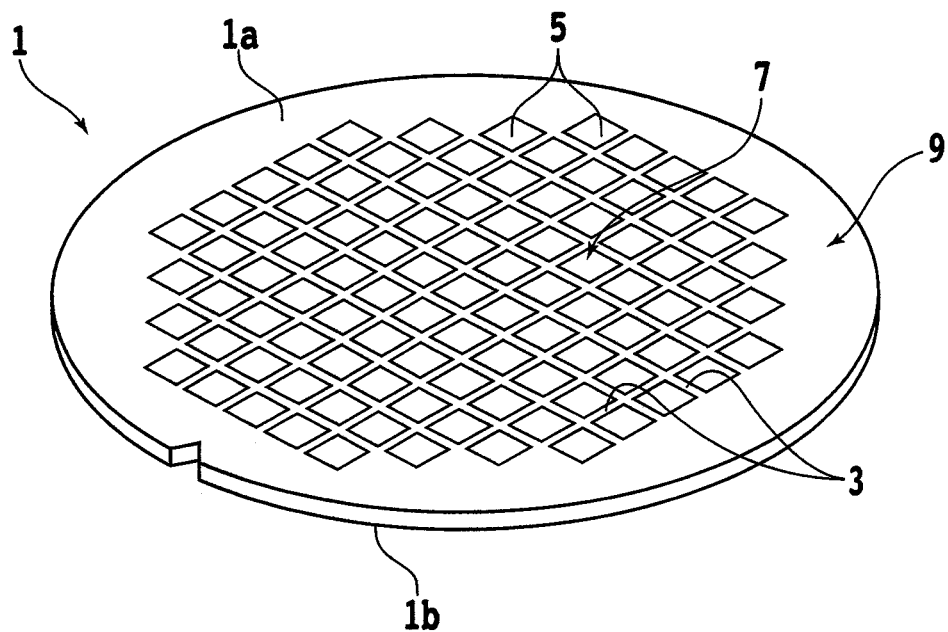
FIG. 1A is a schematic perspective view depicting a front side of a wafer.
Figure 1B:
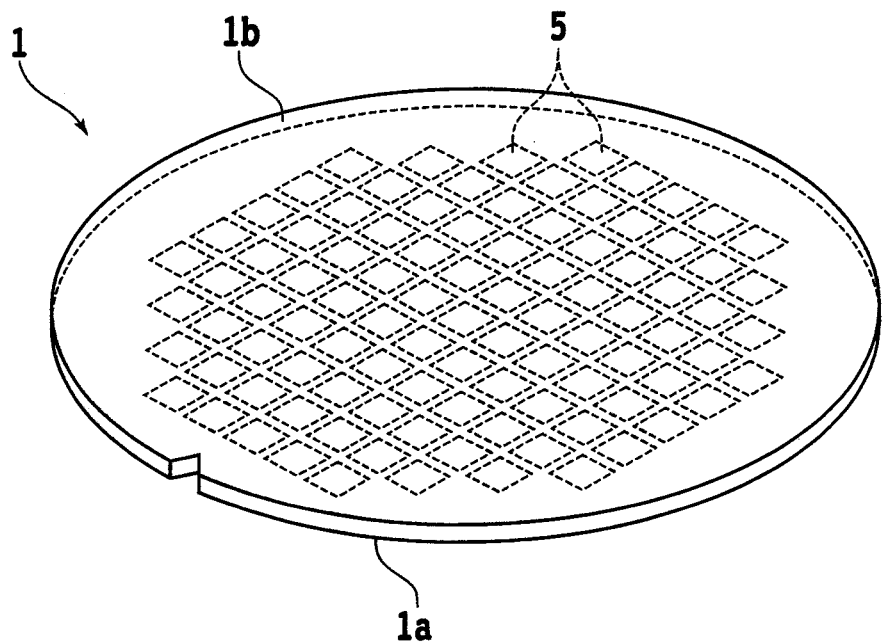
FIG. 1B is a schematic perspective view depicting a back side of the wafer depicted in FIG. 1A.

A preferred embodiment of the present invention will now be described. Referring to FIGS. 1A and 1B, there is depicted a wafer 1 to be processed by a processing method according to this preferred embodiment. FIG. 1A is a schematic perspective view of the wafer 1 in the condition where the front side 1a of the wafer 1 is oriented upward, and FIG. 1B is a schematic perspective view of the wafer 1 in the condition where the back side 1b of the wafer 1 is oriented upward. The wafer 1 is a substantially disk-shaped member formed of silicon, sapphire, silicon carbide (SiC), or any other compound semiconductors, for example. As depicted in FIG. 1A, a plurality of crossing division lines 3 are formed on the front side 1a of the wafer 1 to thereby define a plurality of separate regions in each of which a plurality of devices 5 such as ICs are formed. The front side 1a of the wafer 1 is composed of a device area 7 where the devices 5 are formed and a peripheral marginal area 9 surrounding the device area 7.

In a back grinding step, the back side 1b of the wafer 1 is ground in a central area corresponding to the device area 7 of the front side 1a until the thickness of the wafer 1 is reduced to a finished thickness.

Accordingly, the outside area around the central area of the back side 1b to be ground is not ground to be left as an annular reinforcing portion. Accordingly, the inside area surrounded by the annular reinforcing portion of the back side 1b is formed as a recess having a bottom surface formed by grinding the back side 1b in the back grinding step. In a dividing step to be performed after performing the back grinding step, the wafer 1 is finally cut along the division lines 3 and thereby divided into a plurality of device chips.

Prior to performing the back grinding step, a protective tape 11 (see FIG. 3A) is attached to the front side 1a of the wafer 1. The protective tape 11 functions to prevent the possibility that the devices 5 formed on the front side 1a of the wafer 1 may be damaged by a shock or the like in the back grinding step.

Figure 2:
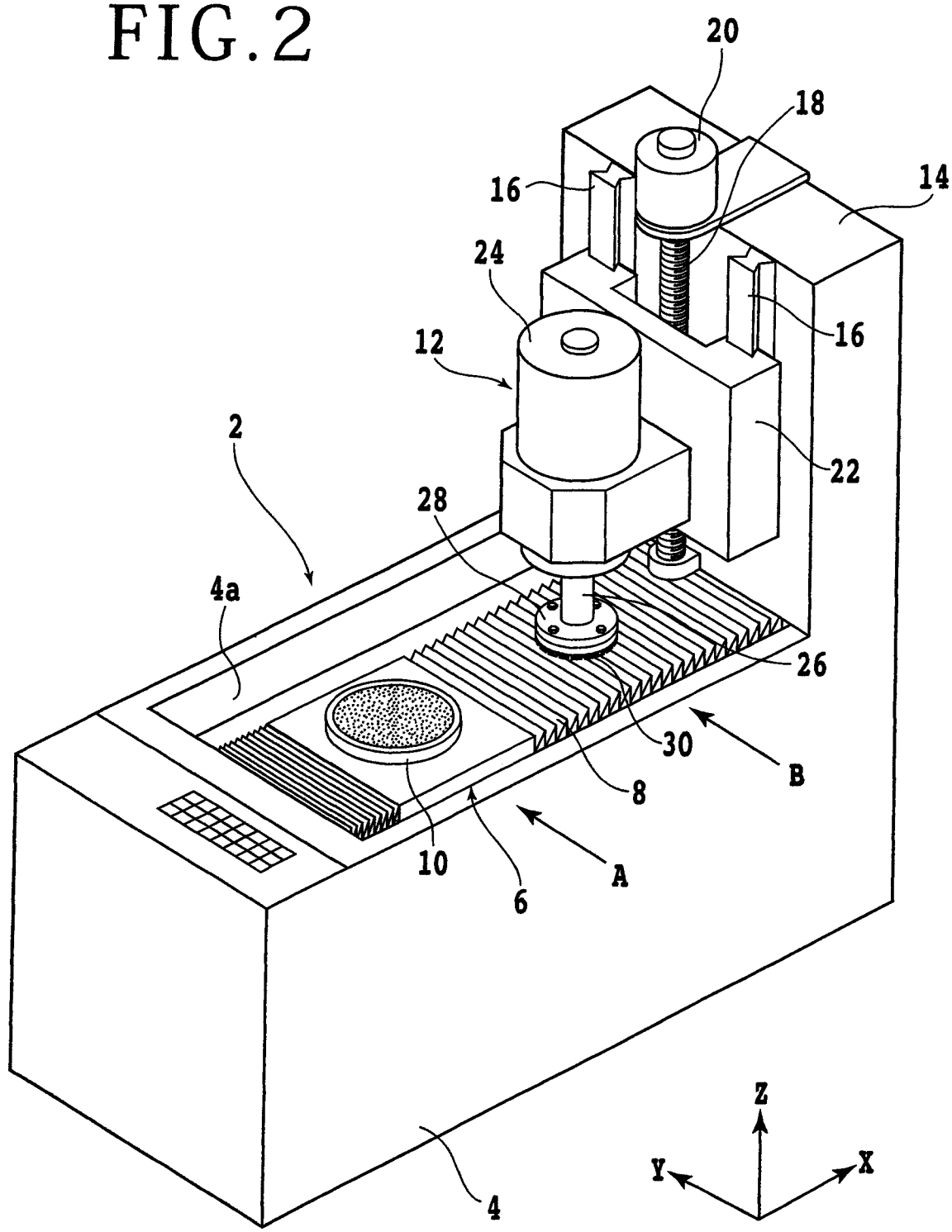
FIG. 2 is a schematic perspective view of a grinding apparatus.

There will now be described a grinding apparatus 2 to be used in the back grinding step with reference to FIG. 2. FIG. 2 is a schematic perspective view depicting the configuration of the grinding apparatus 2. The grinding apparatus 2 depicted in FIG. 2 includes a base 4 having an upper surface. The upper surface of the base 4 is formed with a rectangular recess 4a. An X movable table 6 is provided in the recess 4a so as to be movable in the X direction depicted by an arrow X in FIG. 2. The X movable table 6 is adapted to be moved in the X direction by an X moving mechanism (not depicted). A waterproof cover 8 is connected to the X movable table 6 so as to be located above the X moving mechanism. A chuck table 10 for holding the wafer 1 is provided on the X movable table 6. The chuck table 10 has an upper surface as a holding surface. A suction passage (not depicted) is formed inside the chuck table 10. One end of the suction passage is connected to a vacuum source (not depicted), and the other end of the suction passage is connected to the holding surface of the chuck table 10. The holding surface of the chuck table 10 is formed from a porous member, and the wafer 1 is adapted to be placed on the holding surface. When the vacuum source is operated, a vacuum can be applied through the suction passage and the porous member to the wafer 1 placed on the holding surface, so that the wafer 1 can be held on the holding surface under suction. When the X moving mechanism is operated, the chuck table 10 supported on the X movable table 6 can be moved between a wafer mounting/demounting area A and a grinding area B.

A support portion 14 is formed at the rear end of the base 4 so as to upwardly project from the upper surface of the base 4 in a vertical direction. A grinding unit 12 is supported to the support portion 14. The support portion 14 has a front surface in the X direction, and a pair of parallel Z guide rails 16 extending in the Z direction depicted by an arrow Z in FIG. 2 are provided on the front surface of the support portion 14. A Z movable plate 22 is slidably mounted on the Z guide rails 16. A nut portion (not depicted) is formed on the back side (rear surface) of the Z movable plate 22, and a Z ball screw 18 extending parallel to the Z guide rails 16 is threadely engaged with the nut portion of the Z movable plate 22. A Z pulse motor 20 is connected to one end of the Z ball screw 18. Accordingly, when the Z pulse motor 20 is operated to rotate the Z ball screw 18, the Z movable plate 22 can be moved in the Z direction along the Z guide rails 16.

The grinding unit 12 for grinding the wafer 1 is fixed to the front side (front surface) of the Z movable plate 22 at a lower portion thereof. Accordingly, when the Z movable plate 22 is moved in the Z direction by operating the Z pulse motor 20, the grinding unit 12 can be moved in the Z direction as a feeding direction. The grinding unit 12 includes a spindle housing 24, a spindle 26 adapted to be rotated by a motor mounted in the spindle housing 24 and connected to the upper end (base end) of the spindle 26, a grinding wheel 28 fixedly mounted to the lower end (front end) of the spindle 26 so as to be rotated by the rotation of the spindle 26, and a plurality of abrasive members 30 fixed to the lower surface of the grinding wheel 28 so as to be annularly arranged along the outer circumference of the grinding wheel 28. In performing the back grinding step, the grinding wheel 28 is rotated and lowered to thereby grind the wafer 1 held under suction on the chuck table 10 set in the grinding area B.

Figure 3A:
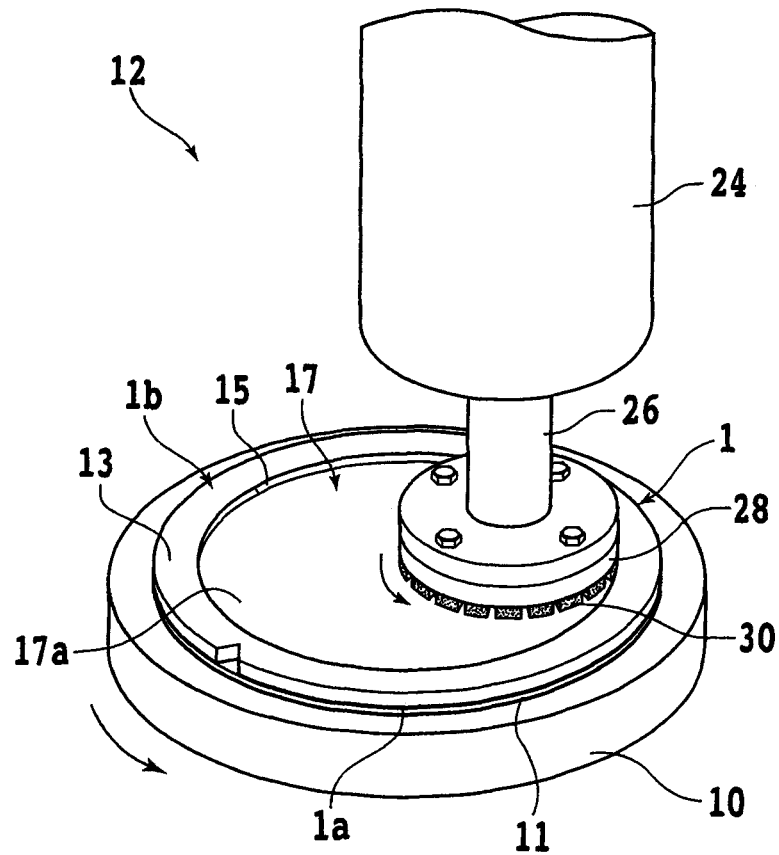
FIG. 3A is a schematic perspective view depicting a back grinding step using the grinding apparatus depicted in FIG. 2.
Figure 3B:
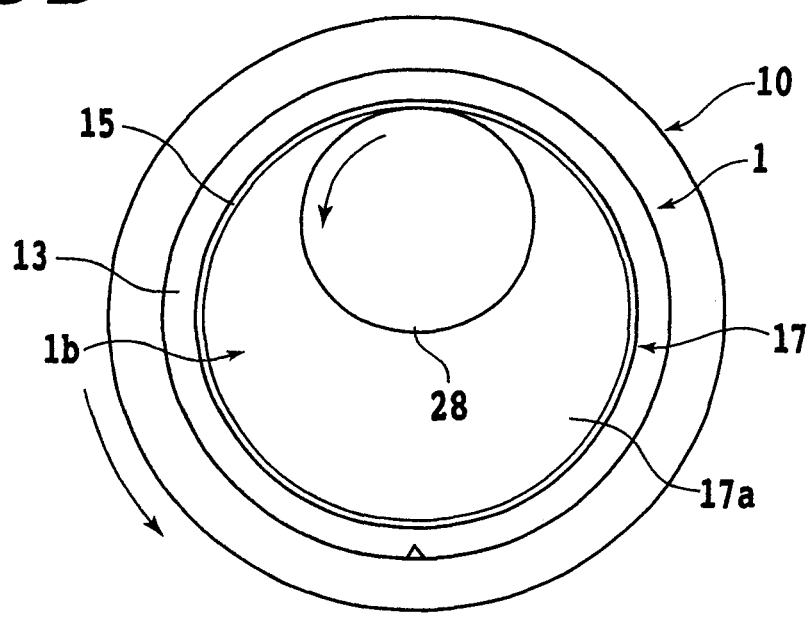
FIG. 3B is a schematic top plan view depicting the back grinding step.
Figure 4A:
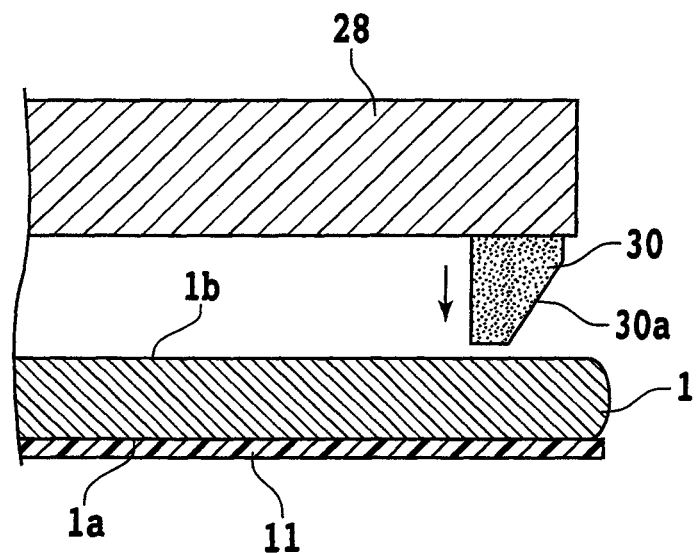
FIG. 4A is a schematic sectional view depicting a condition just before grinding the wafer.

The grinding unit 12 will further be described in more detail. FIG. 3A is a schematic perspective view depicting the back grinding step, and FIG. 3B is a schematic top plan view depicting the back grinding step. As depicted in FIGS. 3A and 3B, the back side 1b of the wafer 1 is ground by the grinding unit 12 to thereby form a recess 17 having a bottom surface 17a on the back side 1b in a central area thereof. As a result, the outside area around the recess 17 on the back side 1b of the wafer 1 is left as an annular reinforcing portion 13. The grinding wheel 28 has a diameter smaller than the diameter of the bottom surface 17a of the recess 17 to be formed by the grinding. Further, FIG. 4A is a schematic sectional view of the grinding wheel 28 and each abrasive member 30 mounted on the lower surface of the grinding wheel 28 just before grinding the back side 1b of the wafer 1. As depicted in FIG. 4A, each abrasive member 30 mounted on the lower surface of the grinding wheel 28 has a taper portion 30a. That is, the outer surface of each abrasive member 30 is gradually tapered from the upper end portion toward the lower end portion of each abrasive member 30 so as to be displaced toward the center of the grinding wheel 28, thus forming the taper portion 30a on the outer surface of each abrasive member 30. In other words, the thickness of each abrasive member 30 is gradually decreased from the upper end portion toward the lower end portion of each abrasive member 30 to form the taper portion 30A on the outer surface of each abrasive member 30. Accordingly, when the back side 1b of the wafer 1 is ground by the abrasive members 30 of the grinding unit 12 to thereby form the recess 17 on the back side 1b, the side surface (inner circumferential surface) of the recess 17 can be formed into a taper surface 15 (see FIG. 4B).

Figure 4B:
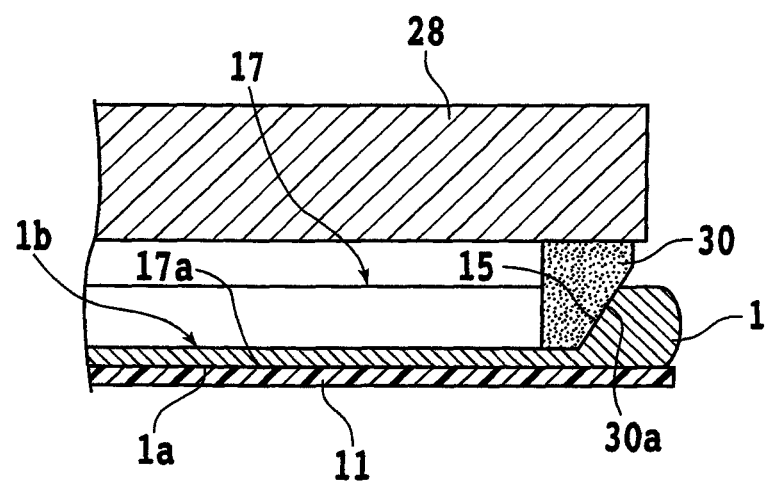
FIG. 4B is a schematic sectional view depicting a condition where the wafer is being ground.

There will now be described each step of the wafer processing method according to this preferred embodiment. First, the back grinding step in the wafer processing method according to this preferred embodiment will be described. FIG. 3A is a schematic perspective view depicting the back grinding step, and FIG. 3B is a schematic top plan view depicting the back grinding step. FIG. 4A is a schematic sectional view depicting a condition just before grinding the back side 1b of the wafer 1, and FIG. 4B is a schematic sectional view depicting a condition where the back grinding is being performed. In performing the back grinding step, the wafer 1 with the protective tape 11 attached to the front side 1a is placed on the holding surface of the chuck table 10 set in the wafer mounting/demounting area A of the grinding apparatus 2 (see FIG. 2) in the condition where the protective tape 11 is in contact with the holding surface of the chuck table 10, i.e., in the condition where the back side 1b of the wafer 1 is oriented (exposed) upward. Thereafter, the vacuum source connected to the chuck table 10 is operated to hold the wafer 1 through the protective tape 11 on the chuck table 10 under suction. Thereafter, the X moving mechanism is operated to move the chuck table 10 to the grinding area B depicted in FIG. 2.

Figure 5:
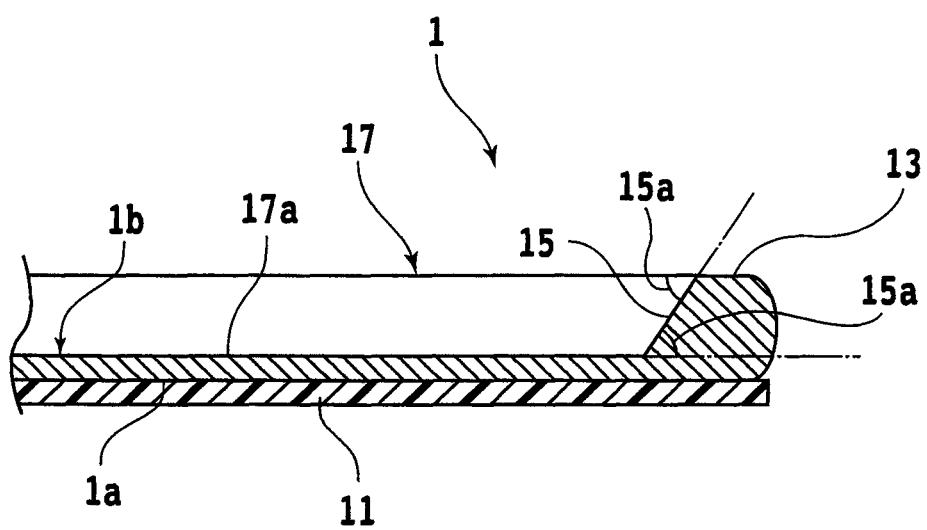
FIG. 5 is a schematic sectional view depicting a taper surface formed by grinding the back side of the wafer.

In the grinding area B, the central area of the back side 1b of the wafer 1 corresponding to the device area 7 of the front side 1a is positioned directly below the grinding wheel 28 as depicted in FIGS. 3A and 3B. Thereafter, the chuck table 10 is rotated by a motor (not depicted) provided in the base 4 (see FIG. 2), and the grinding wheel 28 is also rotated by the motor provided in the spindle housing 24 as depicted by arrows in FIGS. 3A and 3B. Thereafter, the grinding wheel 28 is lowered until the abrasive members 30 come into contact with the back side 1b of the wafer 1, thereby starting the grinding of the back side 1b. That is, the central area of the back side 1b of the wafer 1 corresponding to the device area 7 of the front side 1a is ground by the abrasive members 30. Thereafter, the grinding wheel 28 is further lowered (fed in the Z direction) until the thickness of the wafer 1 in this central area corresponding to the device area 7 is reduced to the finished thickness. Accordingly, as depicted in FIG. 5, the recess 17 is formed on the back side 1b of the wafer 1 in the central area corresponding to the device area 7, and the outside area around the recess 17 on the back side 1b is left as the annular reinforcing portion 13. FIG. 5 is a schematic sectional view depicting a condition where the recess 17 has been formed by the back grinding step. The side surface of the recess 17 is formed as the taper surface 15 having a taper angle 15a.

If the annular reinforcing portion 13 is not formed, i.e., if the whole of the back side 1b of the wafer 1 is uniformly ground, the rigidity of the wafer 1 after grinding is reduced to cause a problem such that the wafer 1 may be easily deformed in the subsequent steps or in transferring the wafer 1 and that the wafer 1 may be easily damaged. To the contrary, the wafer processing method according to this preferred embodiment can exhibit an effect that the wafer 1 is reinforced by the annular reinforcing portion 13, so that a necessary strength of the wafer 1 can be maintained in the subsequent steps or in transferring the wafer 1. Further, in the wafer processing method according to this preferred embodiment, the taper surface 15 is formed between the bottom surface 17a of the recess 17 and the annular reinforcing portion 13 so as to connect them. As depicted in FIG. 5, the taper surface 15 is inclined with respect to a direction perpendicular to the bottom surface 17a of the recess 17.

Figure 6A:
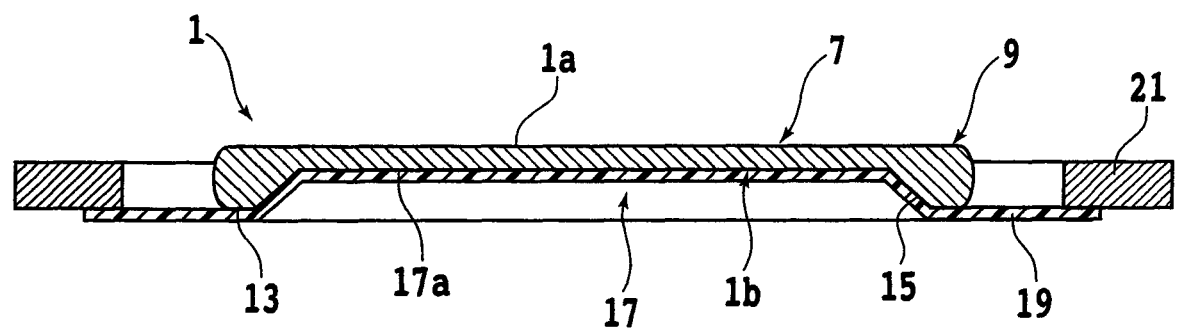
FIG. 6A is a schematic sectional view depicting a condition where a dicing tape supported to an annular frame has been attached to the back side of the wafer after performing the back grinding step.

After performing the back grinding step, a dicing tape attaching step is performed to attach a dicing tape 19 to the back side 1b of the wafer 1 on which the recess 17 has been formed as depicted in FIG. 6A. FIG. 6A is a schematic sectional view depicting a condition where the dicing tape 19 has been attached to the back side 1b of the wafer 1. As depicted in FIG. 6A, a peripheral portion of the dicing tape 19 having a circular shape is supported to an annular frame 21 having an inside opening, and a central portion of the dicing tape 19 is attached to the back side 1b of the wafer 1 in the condition where the wafer 1 is located in the inside opening of the annular frame 21. Thus, the wafer 1, the dicing tape 19, and the annular frame 21 are united together to form a frame unit.

If the recess 17 is formed by any methods other than the processing method according to this preferred embodiment, the side surface of the recess 17 connecting the bottom surface 17a and the annular reinforcing portion 13 becomes a vertical surface perpendicular to the bottom surface 17a of the recess 17. That is, the angle formed between the side surface of the recess 17 and the annular reinforcing portion 13 becomes approximately 90 degrees. In other words, the angle formed between the side surface of the recess 17 and the bottom surface 17a of the recess 17 becomes approximately 90 degrees. In this case, the dicing tape 19 is attached to the back side 1b of the wafer 1 in the subsequent dicing tape attaching step in such a manner that the dicing tape 19 must be brought into close contact with the vertical side surface of the recess 17, the bottom surface 17a of the recess 17, and the annular reinforcing portion 13. However, it is not easy to bring the dicing tape 19 into close contact with the back side 1b of the wafer 1 because the inner circumferential edge of the annular reinforcing portion 13 is right-angled and the outer circumferential edge of the bottom surface 17a of the recess 17 is also right-angled in this case. In such a case that the dicing tape 19 is not in close contact with the back side 1b of the wafer 1, there is a possibility that a crack may be generated in an area where the dicing tape 19 is not in close contact, in performing a subsequent dividing step. Further, there is also a possibility that cutting dust generated in the dividing step may enter a space formed between the wafer 1 and the dicing tape 19 and that this cutting dust may stick to the back side 1b of the wafer 1. As a result, there arises a problem such that the quality of each device chip formed near the outer circumference of the wafer 1 may be reduced.

To the contrary, in the processing method according to this preferred embodiment, the side surface of the recess 17 formed on the back side 1b of the wafer 1 so as to connect the bottom surface 17a and the annular reinforcing portion 13 is formed as the taper surface 15. That is, the angle formed between the taper surface 15 and the annular reinforcing portion 13 is not 90 degrees, i.e., this angle is greater than 90 degrees. In other words, the angle formed between the taper surface 15 and the bottom surface 17a of the recess 17 is not 90 degrees, i.e., this angle is greater than 90 degrees. Accordingly, in attaching the dicing tape 19 to the back side 1b of the wafer 1, the dicing tape 19 can be easily brought into close contact with the back side 1b of the wafer 1, thereby preventing a reduction in quality of each device chip.

The taper angle 15a of the taper surface 15 will now be described with reference to FIG. 5. The taper angle 15a is defined as the angle formed between the taper surface 15 and an extension of the bottom surface 17a of the recess 17 formed on the back side 1b of the wafer 1 as viewed in FIG. 5 which is a cross section of the wafer 1 taken along the diameter thereof.

Alternatively, the taper angle 15a is also defined as the angle formed between the taper surface 15 and an extension of the annular reinforcing portion 13 (more strictly, an extension of the exposed surface of the annular reinforcing portion 13) formed on the back side 1b of the wafer 1 as viewed in FIG. 5. In other words, the taper angle 15a is a supplementary angle of the angle formed between the taper surface 15 and the bottom surface 17a of the recess 17 or a supplementary angle of the angle formed between the taper surface 15 and the annular reinforcing portion 13. If the taper angle 15a is too large, it is not easy to bring the dicing tape 19 into close contact with the back side 1b of the wafer 1. Conversely, if the taper angle 15a is too small, the proportion of the taper surface 15 to the area of the back side 1b corresponding to the peripheral marginal area 9 of the front side 1a (see FIG. 1A) becomes large, that is, the proportion of the taper surface 15 to the annular reinforcing portion 13 becomes large, so that a necessary strength of the annular reinforcing portion 13 cannot be ensured. Accordingly, the taper angle 15a is preferably set in the range of 30 to 75 degrees. When the taper angle 15a is in the range of 30 to 75 degrees, the dicing tape 19 can be easily brought into close contact with the back side 1b of the wafer 1 having the recess 17, and a necessary strength can be ensured in the annular reinforcing portion 13.

Figure 6B:
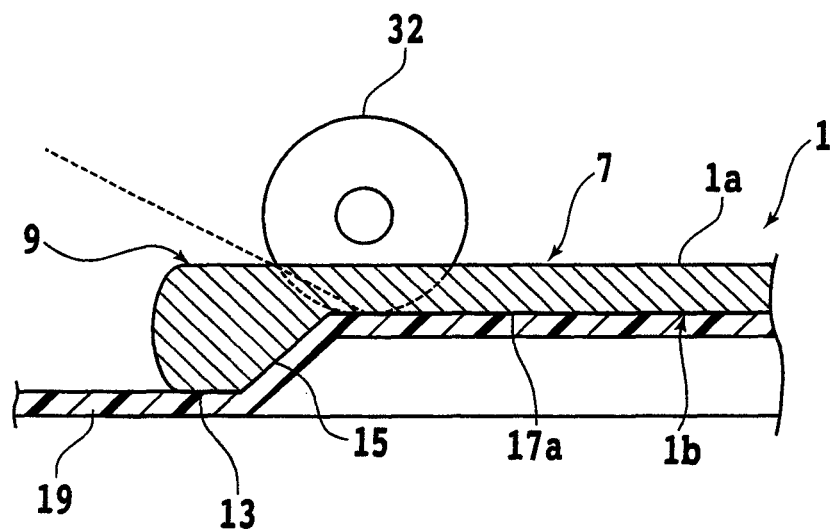
FIG. 6B is a schematic sectional view depicting a dividing step of cutting the wafer.

After performing the dicing tape attaching step, a dividing step is performed to divide the wafer 1 into the individual device chips. The dividing step is performed by using a cutting blade 32 as depicted in FIG. 6B to cut the wafer 1 along the division lines 3 (see FIG. 1A) formed on the front side 1a of the wafer 1. The wafer 1 is cut by the cutting blade 32 in the condition where the front side 1a of the wafer 1 is exposed upward as depicted in FIG. 6B. FIG. 6B is a schematic sectional view depicting the dividing step using the cutting blade 32. Prior to performing the dividing step, the protective tape 11 is previously peeled from the front side 1a of the wafer 1. The dividing step is performed by a cutting apparatus (not depicted) having the cutting blade 32. The cutting apparatus includes a chuck table (not depicted) having a holding surface for holding the wafer 1 through the dicing tape 19. This holding surface has a diameter smaller than the diameter of the bottom surface 17a of the recess 17 formed on the back side 1b of the wafer 1.

The configuration of the chuck table in this cutting apparatus is similar to that of the chuck table 10 in the grinding apparatus 2 depicted in FIG. 2. The cutting blade 32 is an annular member having a peripheral cutting edge and a central through hole. The cutting blade 32 is adapted to be rotated about the axis of the central through hole. In cutting the wafer 1, the cutting blade 32 is rotated and lowered to cut the wafer 1 as moving the chuck table in a feeding direction.

Figure 7:
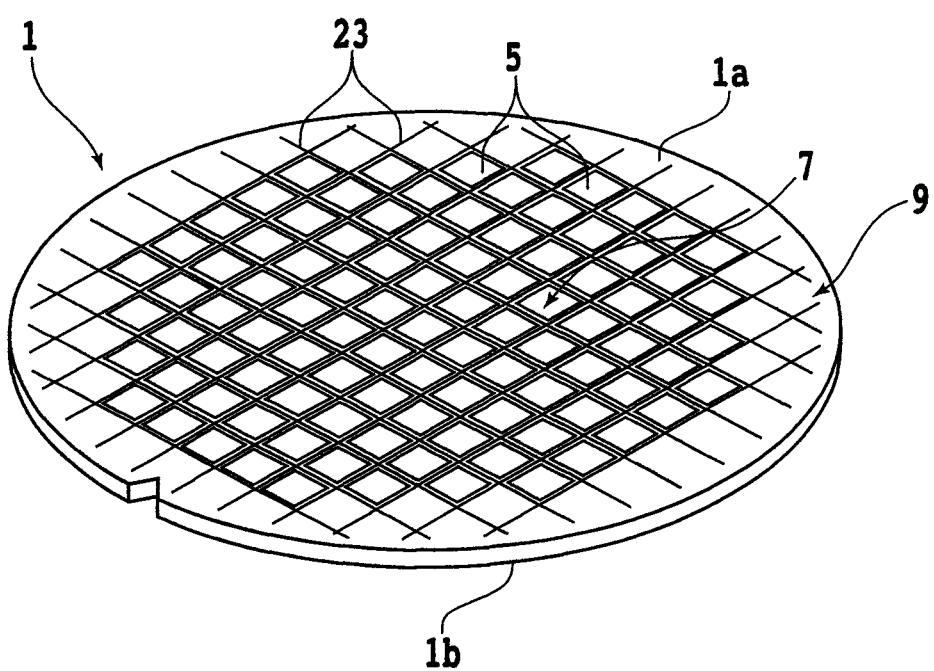
FIG. 7 is a schematic perspective view depicting the front side of the wafer in the condition obtained by performing the dividing step.

In the dividing step, the wafer 1 is first placed on the holding surface of the chuck table in the cutting apparatus. At this time, the wafer 1 is placed on the holding surface of the chuck table through the dicing tape 19 in the condition where the back side 1b of the wafer 1 is oriented downward, i.e., in the condition where the front side 1a of the wafer 1 is oriented (exposed) upward. Thereafter, a vacuum source (not depicted) is operated to hold the wafer 1 through the dicing tape 19 on the holding surface of the chuck table under suction. Thus, the frame unit composed of the wafer 1, the dicing tape 19, and the annular frame 21 is held on the chuck table under suction. Thereafter, the cutting blade 32 is adjusted in position so that the wafer 1 can be cut along a predetermined one of the division lines 3 from one end thereof by using the cutting blade 32. Thereafter, the cutting blade 32 is rotated and lowered as moving the wafer 1 (the chuck table) in the feeding direction coinciding with the direction of extension of the predetermined division line 3. At this time, the cutting blade 32 starts cutting at one end of the predetermined division line 3 inside the outer circumference of the wafer 1 and next continues to cut the wafer 1 along the predetermined division line 3. Thereafter, when the cutting blade 32 reaches the other end of the predetermined division line 3 inside the outer circumference of the wafer 1, the cutting blade 32 is raised from the wafer 1 to stop the cutting. Thereafter, this cutting operation is similarly stepwise performed along the other division lines 3 formed on the front side 1a of the wafer 1. FIG. 7 is a schematic perspective view of the wafer 1 in the condition where the dividing step has been finished. As depicted in FIG. 7, a plurality of crossing cut grooves 23 are formed on the front side 1a of the wafer 1 along all of the division lines 3, thereby dividing the wafer 1 into the individual device chips. As apparent from FIG. 7, an annular area along the outer circumference of the wafer 1 is not cut in the dividing step.

In the dividing step, the wafer 1 in the condition of the frame unit is held on the holding surface of the chuck table. Since the diameter of the holding surface of the chuck table is smaller than the diameter of the bottom surface 17a of the recess 17 formed on the back side 1b of the wafer 1, the outer circumferential portion of the frame unit projects radially outward from the outer circumference of the holding surface. As a result, the dicing tape 19 is pulled radially outward by the weight of the annular frame 21 present outside the holding surface of the chuck table. If the wafer 1 is cut from the outer circumference of the wafer 1 at one position to the outer circumference of the wafer 1 at the opposite position by using the cutting blade 32 by any methods other than the processing method according to this preferred embodiment, each device chip formed by cutting the wafer 1 receives any forces having different directions in cutting the wafer 1, so that there is a possibility that the wafer 1 may be moved during cutting, causing a problem such that the wafer 1 cannot be properly cut along each division line 3.

To the contrary, in the processing method according to this preferred embodiment, the annular area along the outer circumference of the wafer 1 is not cut by the cutting blade 32 in the dividing step. Accordingly, even when the dicing tape 19 is pulled radially outward by the weight of the annular frame 21 in the dividing step, the annular uncut area of the wafer 1 functions to support the dicing tape 19 present radially outside the annular uncut area, so that the force pulling the dicing tape 19 is not transmitted to the central area of the wafer 1 radially inside the annular uncut area. As a result, the movement of the wafer 1 in a plane parallel to the holding surface of the chuck table during cutting of the wafer 1 can be suppressed to thereby allow proper cutting of the wafer 1 along each division line 3. As described above, in the processing method according to this preferred embodiment, the dicing tape 19 can be brought into close contact with the back side 1b of the wafer 1 on which the recess 17 and the annular reinforcing portion 13 surrounding the recess 17 are formed. The dicing tape 19 can be kept in close contact with the boundary between the recess 17 and the annular reinforcing portion 13, thereby properly cutting the wafer 1.

The present invention is not limited to the above preferred embodiment, but various modifications may be made. For example, the grinding operation is performed by using the abrasive members 30 each having the taper surface 30a inclined at a predetermined angle, so as to form the taper surface 15 inclined at a predetermined angle as depicted in FIGS. 4A and 4B in the above preferred embodiment. However, the configuration of the processing method according to this preferred embodiment is merely illustrative. For example, the grinding operation may be performed by using a grinding wheel 28 including abrasive members each having no taper surface. Also in this case, the taper surface 15 can be formed by gradually moving the grinding wheel toward the center of the back side 1b of the wafer 1 as lowering the grinding wheel.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer having a front side and a back side opposite to said front side, said front side of said wafer having a device area and a peripheral marginal area surrounding said device area, a plurality of crossing division lines being formed on said front side of said wafer to thereby define a plurality of separate regions in each of which a plurality of devices are formed, said wafer processing method comprising:

a back grinding step of grinding said back side of said wafer in a central area corresponding to said device area of said front side to thereby form a recess having a bottom surface in said central area of said back side and also form an annular reinforcing portion surrounding said recess;

a dicing tape attaching step of attaching a dicing tape to said back side of said wafer; and a dividing step of cutting said wafer along said division lines from said front side of said wafer by using a cutting blade to thereby divide said wafer into a plurality of individual device chips each corresponding to said devices;

said back grinding step including the step of forming a taper surface between the bottom surface of said recess and said annular reinforcing portion so that said taper surface connects the bottom surface of said recess and said annular reinforcing portion and said taper surface is inclined with respect to a direction perpendicular to the bottom surface of said recess;

said dividing step including the steps of relatively moving said cutting blade and said wafer along a predetermined one of said division lines and lowering said cutting blade toward said wafer to start cutting of said wafer at one end of said predetermined division line radially inside the annular reinforcing portion of said wafer, and raising said cutting blade from said wafer to stop cutting of said wafer at the other end of said predetermined division line radially inside the annular reinforcing portion of said wafer.

2. The wafer processing method according to claim 1, wherein said taper surface to be formed in said back grinding step has a taper angle defined as a supplementary angle of the angle formed between said taper surface and the bottom surface of said recess, said taper angle being set in the range of 30 to 75 degrees.

3. The wafer processing method according to claim 1, wherein a dicing tape attaching step includes attaching said dicing tape to said bottom surface of said recess, said taper surface and said annular reinforcing portion of said wafer.

4. A wafer processing method for processing a wafer having a front side and a back side opposite to said front side, said front side of said wafer having a device area and a peripheral marginal area surrounding said device area, a plurality of crossing division lines being formed on said front side of said wafer to thereby define a plurality of separate regions in each of which a plurality of devices are formed, said wafer processing method comprising:

a back grinding step of grinding said back side of said wafer in a central area corresponding to said device area of said front side to thereby form a recess having a bottom surface in said central area of said back side and also form an annular reinforcing portion surrounding said recess;

a dicing tape attaching step of attaching a dicing tape to said back side of said wafer; and a dividing step of cutting said wafer along said division lines from said front side of said wafer by using a cutting blade to thereby divide said wafer into a plurality of individual device chips each corresponding to said devices;

said back grinding step including the step of forming a taper surface between the bottom surface of said recess and said annular reinforcing portion so that said taper surface connects the bottom surface of said recess and said annular reinforcing portion and said taper surface is inclined with respect to a direction perpendicular to the bottom surface of said recess;

said dividing step including the steps of relatively moving said cutting blade and said wafer along a predetermined one of said division lines and lowering said cutting blade toward said wafer to start cutting of said wafer at one end of said predetermined division line radially inside the outer circumference of said wafer, and raising said cutting blade from said wafer to stop cutting of said wafer at the other end of said predetermined division line radially inside the outer circumference of said wafer, wherein said dividing step includes lowering said cutting blade toward said wafer to start cutting of said wafer at an outer edge of said recess and raising said cutting blade from said wafer to stop cutting of said wafer at an opposing outer edge of said recess.

5. The wafer processing method according to claim 4, wherein said taper surface to be formed in said back grinding step has a taper angle defined as a supplementary angle of the angle formed between said taper surface and the bottom surface of said recess, said taper angle being set in the range of 30 to 75 degrees.

6. The wafer processing method according to claim 4, wherein a dicing tape attaching step includes attaching said dicing tape to said bottom surface of said recess, said taper surface and said annular reinforcing portion of said wafer.

7. The wafer processing method according to claim 1, wherein said dividing step includes lowering said cutting blade toward said wafer to start cutting of said wafer at one end of said predetermined division line at a first point where said taper surface meets said bottom surface of said recess, and raising said cutting blade from said wafer to stop cutting of said wafer at the other end of said predetermined division line at a second point where said taper surface meets said bottom surface of said recess.

8. A wafer processing method for processing a wafer having a front side and a back side opposite to said front side, said front side of said wafer having a device area and a peripheral marginal area surrounding said device area, a plurality of crossing division lines being formed on said front side of said wafer to thereby define a plurality of separate regions in each of which a plurality of devices are formed, said wafer processing method comprising:

a back grinding step of grinding said back side of said wafer in a central area corresponding to said device area of said front side to thereby form a recess having a bottom surface in said central area of said back side and also form an annular reinforcing portion surrounding said recess;

a dividing step of cutting said wafer along said division lines from said front side of said wafer by using a cutting blade to thereby divide said wafer into a plurality of individual device chips each corresponding to said devices;

said dividing step including the steps of relatively moving said cutting blade and said wafer along a predetermined one of said division lines and lowering said cutting blade toward said wafer to start cutting of said wafer at one end of said predetermined division line radially inside the outer circumference of said wafer, and raising said cutting blade from said wafer to stop cutting of said wafer at the other end of said predetermined division line radially inside the outer circumference of said wafer, wherein said dividing step includes lowering said cutting blade toward said wafer to start cutting of said wafer at an outer edge of said recess and raising said cutting blade from said wafer to stop cutting of said wafer at an opposing outer edge of said recess.

9. The wafer processing method according to claim 1, wherein an annular area along an outer circumference of said wafer is not cut by said cutting blade in said dividing step.

* * * * *